(12) United States Patent
Taylor et al.

(10) Patent No.: US 7,223,297 B2
(45) Date of Patent: May 29, 2007

(54) PLANARIZING SOLUTIONS INCLUDING ABRASIVE ELEMENTS, AND METHODS FOR MANUFACTURING AND USING SUCH PLANARIZING SOLUTIONS

(75) Inventors: Theodore M. Taylor, Boise, ID (US); Nagasubramaniyan Chandrasekaran, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/170,295

(22) Filed: Jun. 28, 2005

(65) Prior Publication Data
US 2005/0239382 A1 Oct. 27, 2005

Related U.S. Application Data

(62) Division of application No. 10/683,676, filed on Oct. 9, 2003, now Pat. No. 6,939,211.

(51) Int. Cl.
C09G 1/02 (2006.01)
C09G 1/04 (2006.01)

(52) U.S. Cl. .......................... 51/298; 51/307; 51/308; 51/309; 51/293; 427/212; 427/421.1; 427/427

(58) Field of Classification Search .................. 51/298, 51/307–309, 293; 5/293; 427/212, 421, 427/42, 421.17; 264/7, 12
See application file for complete search history.

(56) References Cited

U.S. PATENT DOCUMENTS

| | | | |
|---|---|---|---|
| 2,692,863 A | 10/1954 | Iler | |
| 4,498,345 A | 2/1985 | Dyer et al. | |
| 4,501,258 A | 2/1985 | Dyer et al. | |
| 4,502,459 A | 3/1985 | Dyer | |
| 4,971,021 A | 11/1990 | Kubotera et al. | |
| 5,036,015 A | 7/1991 | Sandhu et al. | |
| 5,069,002 A | 12/1991 | Sandhu et al. | |
| 5,081,796 A | 1/1992 | Schultz | |
| 5,163,334 A | 11/1992 | Li et al. | |
| 5,209,816 A | 5/1993 | Yu et al. | |
| 5,222,329 A | 6/1993 | Yu | |
| 5,240,552 A | 8/1993 | Yu et al. | |
| RE34,425 E | 11/1993 | Schultz | |
| 5,354,490 A | 10/1994 | Yu et al. | |
| 5,413,941 A | 5/1995 | Koos et al. | |
| 5,433,649 A | 7/1995 | Nishida | |
| 5,433,651 A | 7/1995 | Lustig et al. | |
| 5,439,551 A | 8/1995 | Meikle et al. | |
| 5,476,416 A | 12/1995 | Kodate | |
| 5,540,810 A | 7/1996 | Sandhu et al. | |
| 5,573,442 A | 11/1996 | Morita et al. | |
| 5,632,666 A | 5/1997 | Peratello et al. | |
| 5,643,048 A | 7/1997 | Iyer | |
| 5,663,797 A | 9/1997 | Sandhu | |
| 5,668,061 A | 9/1997 | Herko et al. | |
| 5,681,204 A | 10/1997 | Kawaguchi et al. | |
| 5,738,562 A | 4/1998 | Doan et al. | |
| 5,777,739 A | 7/1998 | Sandhu et al. | |
| 5,798,302 A | 8/1998 | Hudson et al. | |
| 5,827,781 A | 10/1998 | Skrovan et al. | |
| 5,855,804 A | 1/1999 | Walker | |
| 5,868,896 A | 2/1999 | Robinson et al. | |
| 5,893,754 A | 4/1999 | Robinson et al. | |
| 5,895,550 A | 4/1999 | Andreas | |
| 5,910,846 A | 6/1999 | Sandhu | |
| 5,916,819 A | 6/1999 | Skrovan et al. | |
| 5,930,699 A | 7/1999 | Bhatia | |
| 5,934,973 A | 8/1999 | Boucher et al. | |
| 5,936,733 A | 8/1999 | Sandhu et al. | |
| 5,981,396 A | 11/1999 | Robinson et al. | |
| 5,990,012 A | 11/1999 | Robinson et al. | |
| 5,994,224 A | 11/1999 | Sandhu et al. | |
| 6,006,739 A | 12/1999 | Akram et al. | |
| 6,007,408 A | 12/1999 | Sandhu | |

(Continued)

FOREIGN PATENT DOCUMENTS

EP 1020488 A2 7/2000

OTHER PUBLICATIONS

Kondo, S. et al., "Abrasive-Free Polishing for Copper Damascene Interconnection," Journal of The Electrochemical Society, vol. 147, No. 10, pp. 3907-3913, 2000, The Electrochemical Society, Inc., Pennington, NJ.

(Continued)

*Primary Examiner*—Michael A. Marcheschi
(74) *Attorney, Agent, or Firm*—Perkins Coie LLP

(57) ABSTRACT

A planarizing slurry for mechanical and/or chemical-mechanical polishing of microfeature workpieces. In one embodiment, the planarizing slurry comprises a liquid solution and a plurality of abrasive elements mixed in the liquid solution. The abrasive elements comprise a matrix material having a first hardness and a plurality of abrasive particles at least partially surrounded by the matrix material. The abrasive particles can have a second hardness independent of the first hardness of the matrix material. The second hardness, for example, can be greater than the first hardness. The matrix material can be formed into a core having an exterior surface and an interior. Because the abrasive particles are at least partially surrounded by the matrix material, the abrasive particles are at least partially embedded into the interior of the core.

7 Claims, 3 Drawing Sheets

U.S. PATENT DOCUMENTS

| | | | |
|---|---|---|---|
| 6,040,245 A | 3/2000 | Sandhu et al. | |
| 6,046,111 A | 4/2000 | Robinson | |
| 6,057,602 A | 5/2000 | Hudson et al. | |
| 6,060,395 A | 5/2000 | Skrovan et al. | |
| 6,074,286 A | 6/2000 | Ball | |
| 6,077,785 A | 6/2000 | Andreas | |
| 6,108,092 A | 8/2000 | Sandhu | |
| 6,116,988 A | 9/2000 | Ball | |
| 6,124,207 A | 9/2000 | Robinson et al. | |
| 6,136,218 A | 10/2000 | Skrovan et al. | |
| 6,143,123 A | 11/2000 | Robinson et al. | |
| 6,152,803 A | 11/2000 | Boucher et al. | |
| 6,176,763 B1 | 1/2001 | Kramer et al. | |
| 6,176,888 B1 | 1/2001 | Ritt et al. | |
| 6,184,571 B1 | 2/2001 | Moore | |
| 6,187,681 B1 | 2/2001 | Moore | |
| 6,190,494 B1 | 2/2001 | Dow | |
| 6,191,037 B1 | 2/2001 | Robinson et al. | |
| 6,191,864 B1 | 2/2001 | Sandhu | |
| 6,203,404 B1 | 3/2001 | Joslyn et al. | |
| 6,206,754 B1 | 3/2001 | Moore | |
| 6,206,756 B1 | 3/2001 | Chopra et al. | |
| 6,206,757 B1 | 3/2001 | Custer et al. | |
| 6,206,769 B1 | 3/2001 | Walker | |
| 6,208,425 B1 | 3/2001 | Sandhu et al. | |
| 6,213,845 B1 | 4/2001 | Elledge | |
| 6,234,874 B1 | 5/2001 | Ball | |
| 6,234,877 B1 | 5/2001 | Koos et al. | |
| 6,234,878 B1 | 5/2001 | Moore | |
| 6,250,994 B1 | 6/2001 | Chopra et al. | |
| 6,261,151 B1 | 7/2001 | Sandhu et al. | |
| 6,267,650 B1 | 7/2001 | Hembree | |
| 6,271,139 B1 | 8/2001 | Alwan et al. | |
| 6,273,786 B1 | 8/2001 | Chopra et al. | |
| 6,276,996 B1 | 8/2001 | Chopra | |
| 6,287,879 B1 | 9/2001 | Gonzales et al. | |
| 6,290,572 B1 | 9/2001 | Hofmann | |
| 6,301,006 B1 | 10/2001 | Doan | |
| 6,306,012 B1 | 10/2001 | Sabde | |
| 6,306,768 B1 | 10/2001 | Klein | |
| 6,312,486 B1 | 11/2001 | Sandhu et al. | |
| 6,312,558 B2 | 11/2001 | Moore | |
| 6,313,038 B1 | 11/2001 | Chopra et al. | |
| 6,319,420 B1 | 11/2001 | Dow | |
| 6,323,046 B1 | 11/2001 | Agarwal | |
| 6,350,180 B2 | 2/2002 | Southwick | |
| 6,354,917 B1 | 3/2002 | Ball | |
| 6,354,930 B1 | 3/2002 | Moore | |
| 6,362,105 B1 | 3/2002 | Moore | |
| 6,364,746 B2 | 4/2002 | Moore | |
| 6,368,194 B1 | 4/2002 | Sharples et al. | |
| 6,375,548 B1 | 4/2002 | Andreas | |
| 6,376,381 B1 | 4/2002 | Sabde | |
| 6,402,884 B1 | 6/2002 | Robinson et al. | |
| 6,407,000 B1 | 6/2002 | Hudson | |
| 6,440,185 B2 | 8/2002 | Nagata et al. | |
| 6,447,369 B1 | 9/2002 | Moore | |
| 6,537,133 B1 | 3/2003 | Birang et al. | |
| 6,551,366 B1 * | 4/2003 | D'Souza et al. | 51/309 |
| 6,579,799 B2 | 6/2003 | Chopra et al. | |
| 6,609,947 B1 | 8/2003 | Moore | |
| 6,616,725 B2 | 9/2003 | Cho et al. | |
| 6,740,590 B1 | 5/2004 | Yano et al. | |
| 2004/0020132 A1 | 2/2004 | Yokoi | |

OTHER PUBLICATIONS

Kawahashi, N. and M. Hattori, "An Evaluation on The Effects of Newly Designed Abrasives in CMP Slurry," Mat. Res. Soc. Symp. Proc., vol. 671, pp. M2.2.1-M2.2.8, 2001, Materials Research Society, Warrendale, PA.

Choi, K.S. et al., "Engineered porous and coated Silica particulates for CMP applications," Mat. Res. Soc. Symp. Proc., vol. 671, pp. M5.8.1-M5.8.10, 2001, Materials Research Society, Warrendale, PA.

Jindal, A. et al., "Chemical Mechanical Polishing Using Mixed Abrasive Slurries," Electrochemical and Solid-State Letters, vol. 5, No. 7, pp. G48-G50, 2002, The Electrochemical Society, Inc., Pennington, NJ.

Yano, H. et al., "High-performance CMP Slurry with Inorganic/Resin Abrasive for Al/Low k Damascene," Mat. Res. Soc. Symp. Proc., vol. 671, pp. M2.4.1-M2.4.5, 2001, Materials Research Society, Warrendale, PA.

Kawaguchi, H., "Functional polymer microspheres," Prog. Polym. Sci., vol. 25, Issue 8, pp. 1171-1210, Oct. 2000, Elsevier Science Ltd.

Ishizu, K., "Synthesis and Structural Ordering of Core-Shell Polymer Microspheres," Prog. Polym. Sci., vol. 23, Issue 8, pp. 1383-1408, Dec. 1998, Elsevier Science Ltd.

Lee, S-H. et al., "Chemical mechanical polishing of thermal oxide films using silica particles coated with ceria," J. Mater. Res., vol. 17, No. 10, pp. 2744-2749, Oct. 2002, Materials Research Society, Warrendale, PA.

\* cited by examiner

PLANARIZING SOLUTIONS INCLUDING ABRASIVE ELEMENTS, AND METHODS FOR MANUFACTURING AND USING SUCH PLANARIZING SOLUTIONS

CROSS-REFERENCE TO RELATED APPLICATION

This application is a divisional of U.S. application Ser. No. 10/683,676, entitled "PLANARIZING SOLUTIONS INCLUDING ABRASIVE ELEMENTS, AND METHODS FOR MANUFACTURING AND USING SUCH PLANARIZING SOLUTIONS" filed Oct. 9, 2003, now U.S. Pat. No. 6,939,211 issued Sep. 6, 2005. which is incorporated herein by reference in its entirety.

TECHNICAL FIELD

The present invention relates to chemical-mechanical planarization of microfeature workpieces. Several aspects of the present invention are related to unique abrasive elements used in slurries for mechanical and/or chemical-mechanical polishing of microfeature workpieces on the planarizing surface of a polishing pad.

BACKGROUND

Mechanical and chemical-mechanical planarization ("CMP") processes remove material from the surface of microfeature workpieces in the production of microelectronic devices and other products. FIG. 1 schematically illustrates a rotary CMP machine 10 with a platen 20, a carrier head 30, and a planarizing pad 40. The CMP machine 10 may also include an under-pad 50 between an upper surface 22 of the platen 20 and a lower surface of the planarizing pad 40. The under-pad 50 provides a thermal and mechanical interface between the planarizing pad, 40 and the platen 20. A drive assembly 26 rotates the platen 20 (indicated by arrow F) and/or reciprocates the platen 20 back and forth (indicated by arrow G). Since the planarizing pad 40 is attached to the under-pad 50, the planarizing pad 40 moves with the platen 20 during planarization.

The carrier head 30 has a lower surface 32 to which a microfeature workpiece 12 may be attached, or the workpiece 12 may be attached to a resilient pad 34 or bladder system. The carrier head 30 may be a weighted, free-floating wafer carrier, or an actuator assembly 31 may be attached to the carrier head 30 to impart rotational motion to the microfeature workpiece 12 (indicated by arrow J) and/or reciprocate the workpiece 12 back and forth (indicated by arrow I).

The planarizing pad 40 and a planarizing solution 44 define a planarizing medium that mechanically and/or chemically-mechanically removes material from the surface of the microfeature workpiece 12. The planarizing solution 44 may be a conventional CMP slurry with abrasive particles and chemicals that etch and/or oxidize the surface of the microfeature workpiece 12.

To planarize the microfeature workpiece 12 with the CMP machine 10, the carrier head 30 presses the workpiece 12 facedown against the planarizing pad 40. More specifically, the carrier head 30 generally presses the microfeature workpiece 12 against the planarizing solution 44 on a planarizing surface 42 of the planarizing pad 40, and the platen 20 and/or the carrier head 30 moves to rub the workpiece 12 against the planarizing surface 42. As the microfeature workpiece 12 rubs against the planarizing surface 42, the planarizing medium removes material from the face of the workpiece 12. The force generated by friction between the microfeature workpiece 12 and the planarizing medium will, at any given instant, be exerted across the surface of the workpiece 12 primarily in the direction of the relative movement between the workpiece 12 and the planarizing pad 40. The carrier head 30 can include a retaining ring 33 to counter this force and hold the microfeature workpiece 12 in position.

The CMP process must consistently and accurately produce a uniformly planar surface without defects on workpieces to enable precise fabrication of circuits and photopatterns. A nonuniform surface can result, for example, when the removal rate of material is not uniform across the surface of the workpiece.

Defects in the form of voids, tear outs, indents, scratches or chatter marks can be caused by the interface between the workpiece, the planarizing solution, and the planarizing pad. The planarizing solution can greatly affect the nonuniformity in removal rates and the number of defects on a workpiece. For example, hard abrasive particles and/or large abrasive particles are a significant source of defects because they are more likely to cause scratches or other types of surface asperities on the workpiece. On the other hand, small particles have a very low polishing rate that is unacceptable in many applications, and small particles can also cause dishing because they are more likely to contact the inner portions of deep depressions on the workpiece. The problems associated with planarizing solutions are exacerbated as the feature sizes shrink because even slight defects and/or dishing can ruin such small features.

Composite Abrasive Slurries (CAS) show promising results in reducing defects and dishing. FIG. 2 schematically illustrates an existing CAS 44 that has been developed for CMP processing. The slurry 44 includes a liquid solution 60 and composite abrasive particles 70. The composite abrasive particles 70 have cores 72 with exterior surfaces 73 and a plurality of abrasive particles 74. The abrasive particles 74 are held to the exterior surface 73 of a core 72 by interaction forces, such as chemical bonding and/or electrical attraction forces. The cores 72 can be soft cores made from polymeric materials or hard cores made from large abrasive particles. In a soft core application, the composite abrasive particles 70 are formed by (a) forming polymeric microspheres without abrasive particles and then curing the microspheres to make the cores 72, (b) mixing the cores 72 and the abrasive particles 74 in a liquid solution such that the zeta potentials between the cores 72 and the abrasive particles 74 cause the particles 74 to be attracted to the exterior surfaces 73 of the cores 72, and (c) optionally chemically reacting the particles and polymer to form a chemical bond. The known composite abrasive particles 70 accordingly have abrasive particles 74 only on the exterior surfaces 73 of the cores 72.

Although the CAS 44 shown in FIG. 2 produces some desirable results, it also raises several problems for CMP processing. First, the composite abrasive particles 70 require very small abrasive particles 74 that are not readily available. This results in high material costs and requires complex manufacturing techniques to handle such particles. Second, the small abrasive particles 74 can be detached from the cores 72 because the interaction forces may not be sufficient to withstand the forces exerted against the composite abrasive particles 70 during a planarizing cycle. This results in a relatively slow polishing rate and dishing because the CAS 44 begins to act like a conventional CMP slurry with very small particles as more abrasive particles 74 become detached from the cores 72. Third, the liquid solution 60 and any cleaning solutions are limited to maintaining the zeta potentials between the cores 72 and the particles 74 so that the liquid solution 60 does not cause the cores 72 to repel the particles 74. This limits the composition of the cores 72 and the particles 74, and it also restricts the constituents of the planarizing solution. Therefore, existing CASs also have several problems and limitations. Similar limitations exist with mixed abrasive slurries in which different types of abrasive particles are mixed in a common solution.

DETAILED DESCRIPTION

A. Overview

Figure 1:
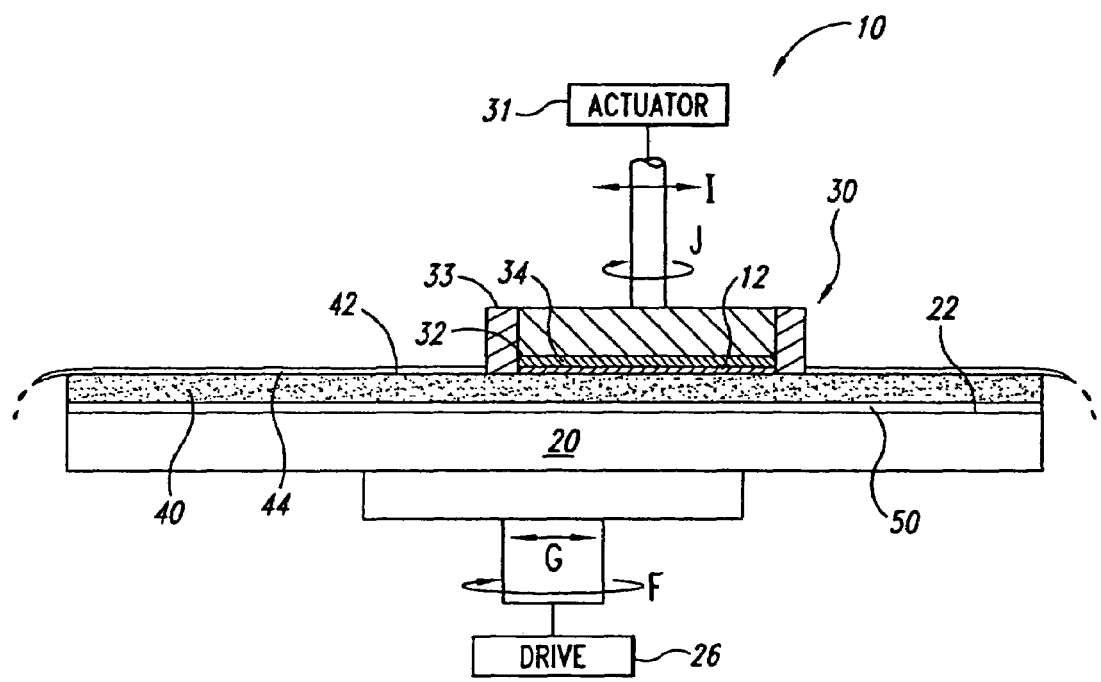
FIG. 1 is a schematic cross-sectional view of a planarizing system in accordance with a prior art.

The present invention is directed to slurries, planarizing systems, and methods for mechanical and/or chemical-mechanical planarization of microfeature workpieces. The term "microfeature workpiece" is used throughout to include substrates in or on which microelectronic devices, micromechanical devices, data storage elements, and other features are fabricated. For example, microfeature workpieces can be semiconductor wafers, glass substrates, insulated substrates, or many other types of substrates. Furthermore, the terms "planarization" and "planarizing" mean either forming a planar surface and/or forming a smooth surface (e.g., "polishing"). Several specific details of the invention are set forth in the following description and in FIGS. 3–8 to provide a thorough understanding of certain embodiments of the invention. One skilled in the art, however, will understand that the present invention may have additional embodiments, or that other embodiments of the invention may be practiced without several of the specific features explained in the following description.

One aspect of the invention is directed to a planarizing slurry for mechanical and/or chemical-mechanical planarization of microfeature workpieces. In one embodiment, the planarizing slurry comprises a liquid solution and a plurality of abrasive elements mixed in the liquid solution. The abrasive elements comprise a matrix material having a first hardness and a plurality of abrasive particles at least partially within the matrix material. The matrix material can be formed into a core having an exterior surface and an interior. The abrasive particles can have a second hardness independent of the first hardness of the matrix material. The first and second hardnesses, for example, can be different from each other such that the first hardness is either greater or less than the second hardness. In several embodiments, the abrasive particles are at least partially surrounded by the matrix material such that the abrasive particles are at least partially embedded into the interior of the core.

Another aspect of the invention is a planarizing system for chemical-mechanical planarization of microfeature workpieces. In one embodiment, the planarizing system includes a support member, a planarizing pad on the support member, and a workpiece holder configured to releasably retain a microfeature workpiece relative to the planarizing pad. The planarizing system further includes a planarizing slurry disposed on a planarizing surface of the planarizing pad. The planarizing slurry can comprise a liquid solution and a plurality of abrasive elements mixed in the liquid solution. The abrasive elements can comprise a matrix material and a plurality of abrasive particles at least partially within and bonded to the matrix material. As explained above, the matrix material can have a first hardness, and the abrasive particles can have a second hardness independent of the first hardness of the matrix material.

Another aspect of the present invention is a method of processing a microfeature workpiece. In one embodiment, the method includes disposing a planarizing slurry on a planarizing surface. The planarizing slurry can comprise any of the foregoing embodiments of planarizing slurries. For example, the planarizing slurry can comprise a liquid solution and a plurality of abrasive elements including a matrix material having a first hardness and a plurality of abrasive particles at least partially within and bonded to the matrix material. The method further includes removing material from the workpiece with the abrasive elements.

Still another aspect of the present invention is a method of manufacturing a slurry for chemical-mechanical planarization of microfeature workpieces. In one embodiment, the method includes making a plurality of abrasive elements by (a) mixing a plurality of abrasive particles and a matrix material when the matrix material is in a flowable state, and (b) atomizing the mixture of the matrix material and the abrasive particles into microspheres or other shapes with embedded abrasive particles. The abrasive elements accordingly have a volume of the matrix material and a number of the abrasive particles at least partially embedded into the matrix material. The method further includes mixing the abrasive elements with a liquid solution to form the planarizing slurry. In another embodiment, the method of making the abrasive elements further includes curing the matrix material to harden the matrix material and further retain the abrasive particles.

B. Embodiments of Abrasive Elements and Planarizing Slurries

Figure 3:
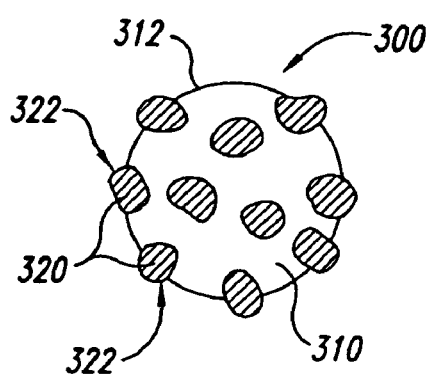
FIG. 3 is a schematic cross-sectional view of an abrasive element for a composite abrasive slurry in accordance with an embodiment of the invention.

FIG. 3 is a schematic cross-sectional view illustrating an abrasive element 300 in accordance with one embodiment of the invention. In this embodiment, the abrasive element 300 includes a matrix material 310 and a plurality of abrasive particles 320. The matrix material 310 defines a core or binder with an exterior surface 312, and the abrasive particles 320 are at least partially embedded into the interior of the matrix material 310. The abrasive particles 320 are not merely attached to the exterior surface 312 of the matrix material 310, but rather the abrasive particles 320 are at least partially surrounded by the matrix material 310. Several of the abrasive particles 320, for example, are at least partially contained within and bonded to the interior of the matrix material 310. Some of the abrasive particles 320 have bearing surfaces 322 projecting beyond the exterior surface 312 of the matrix material 310. The bearing surfaces 322 of these abrasive particles 320 provide the mechanical elements that abrade the workpieces. As shown in FIG. 3, several other abrasive particles 320 can be completely surrounded by the matrix material 310 such that these abrasive particles 320 do not have an exposed bearing surface.

The matrix material 310 is generally selected to be chemically compatible with a liquid solution with which the abrasive elements 300 are mixed to make a slurry. The matrix material 310 is also selected for its hardness or other physical properties for controlling the removal rate, mitigating defects, inhibiting dishing, or meeting other performance criteria. In one embodiment, the matrix material 310 is a polymer microsphere core in which the abrasive particles 320 are embedded. The matrix material 310, however, can be formed into cores having configurations other than microspheres and being composed of materials other than polymers. In general, the matrix material 310 should be formed into cores that are discrete particle-like elements with a size not greater than 50 µm and, more particularly, from approximately 0.1 µm to 10.0 µm. The discrete cores formed from the matrix material 310 are accordingly sized to be suspended or otherwise mixed in the liquid solution of the planarizing slurry. Suitable materials for the matrix material 310 include latex, such as an emulsion polymerization of dienes or dienes with styrene. Other suitable materials include styrene, urethane, butyl rubber, silicones, and polyethylene. Urethane, for example, may be beneficial because the hardness of the urethane microspheres can be controlled by controlling the degree of cross linking and the amount of abrasives or other solids in the urethane. Because butyl rubber is relatively soft, butyl rubber may be beneficial in applications where it is desirable for the matrix material to erode and expose interior abrasive particles.

The abrasive particles 320 are selected to have a hardness independent of the hardness of the matrix material 310. For example, the matrix material 310 can have a first hardness and the abrasive particles 320 can have a second hardness greater than the first hardness of the matrix material 310. In other embodiments, however, the second hardness can be less than or equal to the first hardness. Suitable materials for the abrasive particles 320 include aluminum oxide, cerium oxide, silica, alumina, coated silicon oxides, zirconium compounds, titanium compounds, and other abrasive materials suitable for planarizing microfeature workpieces. The abrasive particles can have a median size of approximately 1 nm to approximately 0.5 µm. In several embodiments, the abrasive particles have a median size of approximately 25 nm to 250 nm, and in certain embodiments from approximately 50nm to approximately 100 nm.

The abrasive elements 300 can be configured to provide a desired polishing rate, inhibit dishing, and reduce defects. The polishing rate of the abrasive elements 300 can be controlled by the compositions of the matrix material and the abrasive particles, the percentage of abrasive particles by volume or by weight in the elements, and the size of the matrix material and/or the abrasive particles. In general, the abrasive elements 300 should be sufficiently hard to have a reasonable polishing rate without being so hard that they produce defects. The abrasive elements 300 can inhibit defects by having sufficiently small bearing surfaces 322 projecting from the matrix material 310 and/or a sufficiently elastic or deformable matrix material 310 to avoid scratching or producing other surface asperities on the workpiece.

The size of the bearing surfaces 322 can be controlled by the size of the abrasive particles 320 and the extent that the outer abrasive particles 320 project beyond the matrix material 310. Additionally, dishing can be inhibited by having a sufficiently large overall size for the abrasive elements 300 and by embedding the abrasive particles 320 into the matrix material 310 so that they are not easily detached. The aspect of having a composite abrasive element 300 with embedded abrasive particles 320 enables a wide range of options to achieve a sufficiently high polishing rate without creating unacceptable defects and dishing. Thus, several embodiments of the abrasive elements 300 provide significant advantages over existing composite abrasive slurries and other types of slurries, as explained below.

Figure 2:
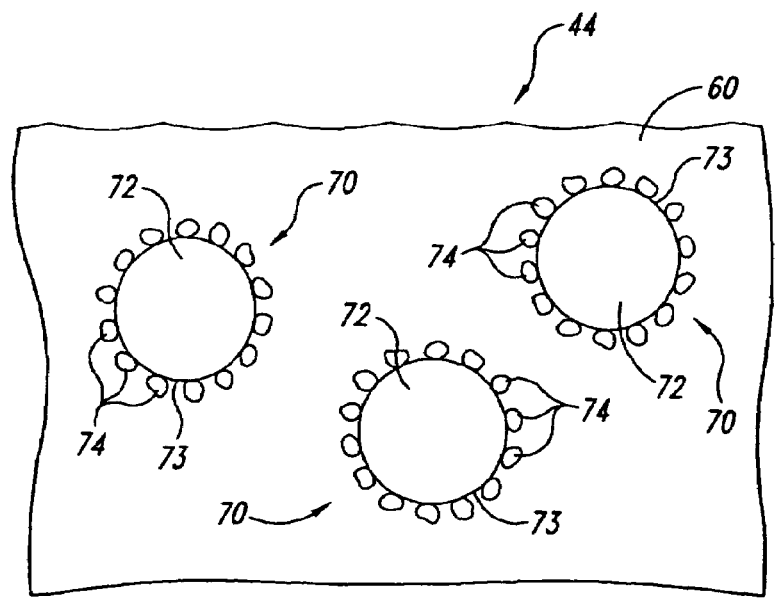
FIG. 2 is a schematic cross-sectional view of a composite abrasive slurry in accordance with the prior art.

One advantage of several embodiments of the abrasive element 300 shown in FIG. 3 is that the embedded abrasive particles 320 are not as likely to be detached from the matrix material 310 compared to the composite abrasive particles shown in FIG. 2. Embedding the abrasive particles 320 within the matrix material 310 provides a strong bond between the abrasive particles 320 and the matrix material 310. This allows the abrasive elements 300 to be used in a wider range of solutions because the pH of the solution is not limited by the zeta potentials of the abrasive particles 320 and the matrix material 310. As such, a broad range of matrix materials can be used in a broad range of planarizing solutions and cleaning solutions to provide very good results for both planarizing and cleaning workpieces. Also, because only the bearing surfaces 322 of the abrasive particles 320 are exposed to the workpieces, the abrasive elements 300 can have larger abrasive particles 320 than existing CAS slurries that have particles only on the exterior surface of the core. This allows the abrasive elements to use less expensive, larger particles to reduce the costs of the slurry without producing defects normally associated with larger particles. Moreover, embedding the abrasive particles 320 into the matrix material 310 is expected to provide a more consistent polishing rate throughout a planarizing cycle because the abrasive particles 320 stay attached to the matrix material 310 during a planarizing cycle. The aggregate surface area of abrasive particles 320 exposed to the workpiece is expected to remain reasonably consistent throughout a planarizing cycle.

Another advantage of several embodiments of the abrasive elements 300 is that they do not produce dishing. The overall size of the abrasive elements 300 is sufficiently large to prevent removal of material from deep within depressions on the workpiece. Also, because the abrasive particles 320 are securely bonded to the matrix material 310, the abrasive particles 320 do not become detached from the matrix material 310. Therefore, the abrasive elements 300 are also expected to reduce dishing in CMP processes.

Yet other advantages of several embodiments of the abrasive elements 300 are that they produce a high polishing rate with abrasive surfaces that do not produce defects. Several embodiments of the abrasive elements 300 thus provide the benefits of a high polishing rate with low defects while mitigating dishing.

Figure 4:
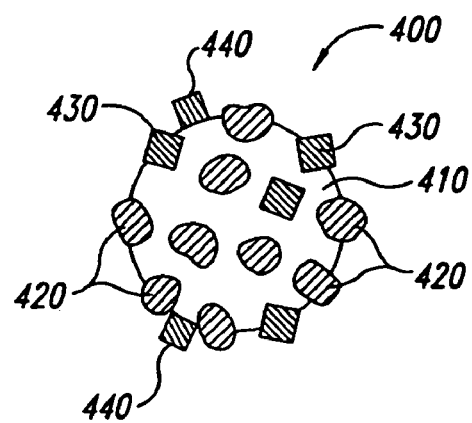
FIG. 4 is a schematic cross-sectional view of an abrasive element for a composite abrasive slurry in accordance with another embodiment of the invention.

FIG. 4 is a schematic cross-sectional view illustrating an abrasive element 400 in accordance with another embodiment of the invention. In this embodiment, the abrasive element 400 includes a matrix material 410 defining a core, a plurality of first abrasive particles 420, and a plurality of second particles 430. The first abrasive particles 420 are at least partially embedded into the matrix material 410 such that they are at least partially within the matrix material 410. The second particles 430 can also be embedded into the matrix material 410, but in some embodiments the second particles 430 can be surface particles 440 that are merely attached to the exterior surface of the matrix material 410.

The first abrasive particles 420 can be composed of a first material and the second particles 430 can be composed of second material different from the first material. In another embodiment, the first abrasive particles 420 can have a first size and the second particles 430 can have a second size different from the first size. The first abrasive particles 420 and the second particles 430, for example, are not limited to being composed of different materials; rather, they may have different median sizes but be composed of the same material. It will be appreciated that at least one property of the first abrasive particles 420, such as the size, composition, shape, hardness, etc., is different from a property of the second particles 430.

Several embodiments of the abrasive elements 400 may provide desirable planarizing characteristics to the planarizing slurry. For example, the first abrasive particles 420 can be one type of an abrasive and the second particles 430 can be another type of an abrasive. The abrasive elements 400 can provide such results because embedding the particles 420 and 430 into the matrix material 410 enables much more flexibility in selecting materials for the abrasive elements compared to existing composite abrasive particles that are limited to materials and liquid solutions which provide the correct zeta potentials.

Figure 5:
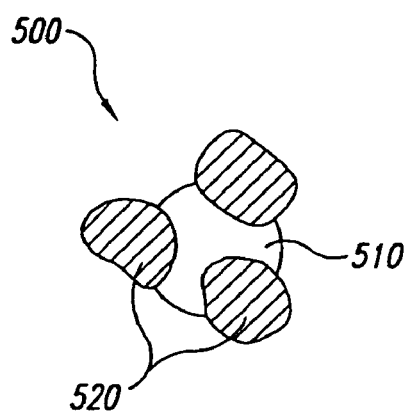
FIG. 5 is a schematic cross-sectional view of an abrasive element for a composite abrasive slurry in accordance with another embodiment of the invention.

FIG. 5 is a schematic cross-sectional view illustrating an abrasive element 500 in accordance with yet another embodiment of the invention. In this embodiment, the abrasive element 500 includes a matrix material 510 and relatively large abrasive particles 520 at least partially embedded within the matrix material 510. The abrasive element 500 accordingly illustrates that the overall size of the abrasive element 500 can remain substantially the same as abrasive elements 300 and 400, but that the abrasive particles can be much larger to reduce dishing on the surface of a workpiece and avoid using costly small particles.

Figure 6:
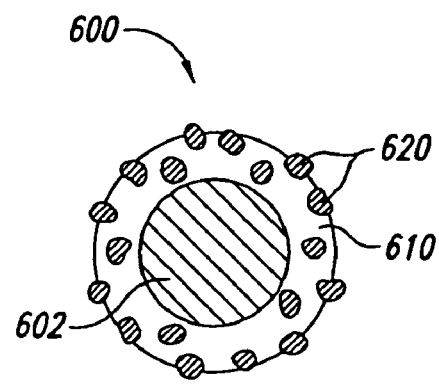
FIG. 6 is a schematic cross-sectional view of an abrasive element for a composite abrasive slurry in accordance with another embodiment of the invention.

FIG. 6 is a schematic cross-sectional view illustrating an abrasive element 600 in accordance with another embodiment of the invention. In this embodiment, the abrasive element 600 includes an inner part 602, a matrix material 610 surrounding the inner part 602, and a plurality of abrasive particles 620 at least partially embedded into the matrix material 610. The inner part 602 can be a relatively inexpensive material, or it can be selected to provide a desired hardness or size to the abrasive element 600. The abrasive element 600 may be particularly useful for producing large abrasive elements because the inner element 602 can be sized to increase the overall element size. The abrasive element 600 can also be particularly useful to reduce the amount of matrix material 610 and/or abrasive particles 620 that are used to form the abrasive element 600 for reducing material costs.

The abrasive elements 300, 400 and 500 illustrated in FIGS. 3–5, respectively, can be formed by mixing the abrasive particles with the matrix material while the matrix material is in a flowable state. In the case of polymeric matrix materials, for example, the abrasive particles can be mixed with a polymer melt. In general, the mixture of the matrix material and the abrasive particles is approximately 10%–99% matrix material by volume with approximately 1%–90% abrasive particles by volume. In other embodiments, the composition can have approximately 60%–90% matrix material by volume and approximately 10%–40% abrasive particles by volume. The individual abrasive elements can then be formed by emulsion polymerization, spray drying, or heterogeneous polymerization techniques. After the individual abrasive elements are formed, the polymeric matrix material can be cured or otherwise hardened in an optional process to securely bind the abrasive particles to the matrix material. In another optional process, part of the cured matrix material can then be dissolved to expose more of the bearing surfaces of the outer abrasive particles. Such erosion of the matrix material can accordingly optimize the abrasiveness of the abrasive elements.

Another advantage of several embodiments of the abrasive elements illustrated above with respect to FIGS. 3–5 is that they are relatively simple to manufacture. Because the solid abrasive particles can be mixed with the polymer melt before forming the abrasive elements, it is possible to precisely control the distribution of the abrasive particles within the abrasive elements. This is also expected to provide good control of the hardness and abrasiveness of the abrasive elements.

The abrasive element 600 shown in FIG. 6 can be made by mixing the abrasive particles 620 with the matrix material 610 while the matrix material 610 is in a flowable state. The inner part 602 can then be coated with the flowable mixture of matrix material 610 and abrasive particles 620. The matrix material 610 can be cured in an optional procedure after coating the inner part 602.

C. Embodiments of Planarizing Systems and Methods of Processing Workpieces

Figure 7:
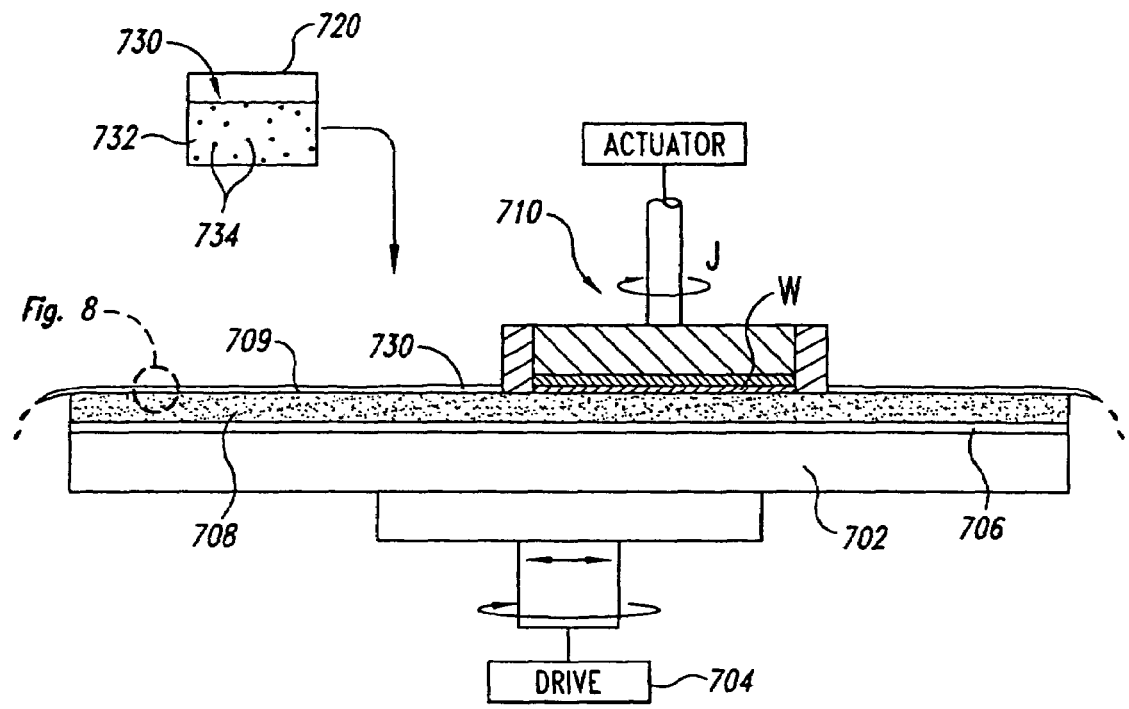
FIG. 7 is a schematic cross-sectional view of a planarizing system using a composite abrasive slurry in accordance with an embodiment of the invention.

FIG. 7 is a schematic cross-sectional view illustrating a planarizing system 700 for planarizing a microfeature workpiece W using planarizing slurries with abrasive elements in accordance with an embodiment of the invention. The planarizing system 700 can include a support member 702, such as a platen, and a drive assembly 704 coupled to the support member 702 to rotate and/or translate the support member 702. The planarizing system 700 further includes a subpad 706 on the support member 702 and a planarizing pad 708 on the subpad 706. The planarizing pad 708 has a planarizing surface 709 configured to engage the workpiece W. The planarizing system 700 further includes a carrier assembly 710 having a workpiece holder 712 and an actuator 714 coupled to the workpiece holder 712. The actuator 714 moves the workpiece holder 712 to (a) raise and lower the workpiece W relative to the planarizing pad 708, and (b) rotate and/or translate the workpiece holder 712 relative to the planarizing surface 709.

The planarizing system 700 further includes a slurry supply 720 containing a planarizing slurry 730 in accordance with an embodiment of the invention. For example, the planarizing slurry 730 can include a liquid solution 732 and a plurality of abrasive elements 734 suspended or otherwise mixed in the liquid solution 732. The abrasive elements 734 can be any of the embodiments of abrasive elements 300, 400, 500, and 600 described above. The slurry supply 720 dispenses the planarizing slurry 730 onto the planarizing surface 709 of the planarizing pad 708 (shown schematically).

Figure 8:
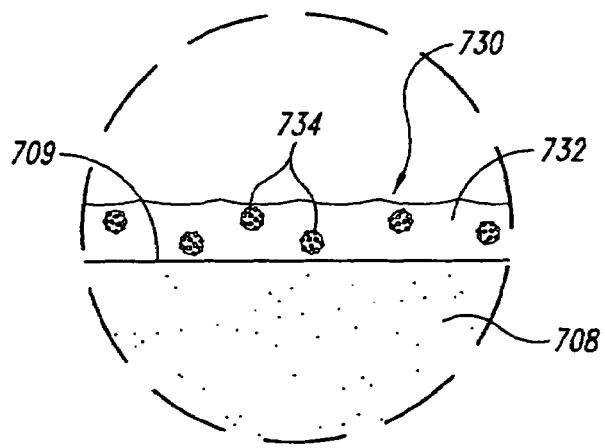
FIG. 8 is a cross-sectional view showing a portion of the planarizing system of FIG. 7 in greater detail.

FIG. 8 is a cross-sectional view illustrating a portion of the planarizing system 700 of FIG. 7 in greater detail. Referring to FIG. 8, the planarizing slurry 730 typically covers the planarizing surface 709 of the planarizing pad 708. In operation, a method of planarizing a microfeature workpiece accordingly comprises disposing the planarizing slurry 730 onto the planarizing surface 709 such that a plurality of the abrasive elements 734 and the liquid solution 732 contact the workpiece Was the support member 702 and/or the workpiece holder 712 move relative to each other.

The abrasive elements 734 accordingly remove material from the surface of the workpiece W.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of manufacturing a slurry for chemical-mechanical planarization of microfeature workpieces, the method comprising:
    mixing a plurality of abrasive particles and a matrix material when the matrix material is in a flowable state;
    atomizing the mixture of the matrix material and the abrasive particles into units defining discrete abrasive elements, wherein the abrasive elements have a volume of the matrix material and one or more of the abrasive particles partially embedded into the matrix material; and
    mixing the abrasive elements with a liquid solution.

2. The method of claim 1, further comprising modifying a property of the abrasive elements after atomizing the mixture.

3. The method of claim 1 wherein mixing a plurality of abrasive particles and a matrix material includes mixing (a) a matrix material comprising a polymer, and (b) a plurality of abrasive particles comprising aluminum oxide, alumina, silicon oxide, coated silicon oxides, silica, cerium oxide, zirconium compounds, and/or titanium compounds.

4. The method of claim 1 wherein:
    mixing a plurality of abrasive particles and a matrix material includes mixing the plurality of abrasive particles with a matrix material comprising a polymer; and
    atomizing the mixture of the matrix material and the abrasive particles into units defining discrete abrasive elements includes forming abrasive elements with the volume of the matrix material defining a core having a size not greater than 50 µm.

5. The method of claim 1 wherein atomizing the mixture of the matrix material and the abrasive particles into units defining discrete abrasive elements includes forming abrasive elements with (a) the volume of the matrix material defining a core having a size from approximately 0.1 µm to 10.0 µm, and (b) the abrasive particles having a median size from approximately 1 nm to approximately 0.5 µm.

6. The method of claim 1 wherein mixing a plurality of abrasive particles and a matrix material includes mixing a matrix material comprising a polymer with a plurality of first abrasive particles having a first composition and a plurality of second abrasive particles having a second composition different than the first composition.

7. The method of claim 1 wherein atomizing the mixture of the matrix material and the abrasive particles into small defining discrete abrasive elements includes forming abrasive elements with the matrix material including a first material at the center and a second material coating the first material, and wherein the abrasive particles are partially embedded into the second material.

* * * * *